United States Patent
Yaroslavsky

(12) 
(10) Patent No.: US 6,709,519 B2
(45) Date of Patent: Mar. 23, 2004

(54) METHOD AND APPARATUS FOR NON-CONTACT, IN-SITU TEMPERATURE MEASUREMENT OF A SUBSTRATE FILM DURING CHEMICAL VAPOR DEPOSITION OF THE SUBSTRATE FILM

(75) Inventor: Mikhail Yaroslavsky, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 13 days.

(21) Appl. No.: 10/454,149

(22) Filed: Jun. 4, 2003

(65) Prior Publication Data

US 2003/0205199 A1 Nov. 6, 2003

Related U.S. Application Data

(62) Division of application No. 09/933,955, filed on Aug. 21, 2001, now Pat. No. 6,596,339.

(51) Int. Cl.$^7$ ................................................ C23C 16/00
(52) U.S. Cl. .............. 118/712; 156/345.24; 156/345.27
(58) Field of Search ................................ 118/712, 725; 156/345.24, 345.27, 345.52; 374/161; 427/8

(56) References Cited

U.S. PATENT DOCUMENTS 5,568,978 A  *  10/1996  Johnson et al. ............. 374/161
5,653,539 A  *  8/1997   Rosengaus .................. 374/159
6,062,729 A     5/2000   Ni et al. ..................... 374/161

* cited by examiner

Primary Examiner—Parviz Hassanzadeh
(74) Attorney, Agent, or Firm—Stallman & Pollock LLP

(57) ABSTRACT

A method and apparatus for the non-contact in-situ temperature measurement of a material layer during chemical vapor deposition of the material on an underlying substrate are provided. Magnitude modulated UV light having a plurality of separated spectral components is directed at the material being deposited on the substrate. The modulated UV light has a plurality of wavelengths corresponding to different temperature dependencies of absorptance in the deposited material. The separated spectral components are within transparency spectral windows of a plasma media contained in the CVD reactor. A portion of the magnitude modulated UV light is directed as a reference into a comparison device, such as a spectrophotometer. Light reflected from the deposited material is also directed at the comparison device for comparison with the reference light. That is, the magnitudes of the magnitude modulated components of the reflected light and the reference light are compared at more than one spectral component. The temperature of the deposited material is derived from this comparison. The results of the comparison are then utilized to control the temperature of the substrate on which the material is being deposited.

1 Claim, 3 Drawing Sheets

METHOD AND APPARATUS FOR NON-CONTACT, IN-SITU TEMPERATURE MEASUREMENT OF A SUBSTRATE FILM DURING CHEMICAL VAPOR DEPOSITION OF THE SUBSTRATE FILM

This application is a division of U.S. application Ser. No. 09/933,955, filed Aug. 21, 2001 now U.S. Pat. No. 6,596,339.

BACKGROUND OF THE INVENTION

1. Field of the Invention

The present invention relates to the formation of a material layer by chemical vapor deposition (CVD) and, in particular, to a method and apparatus for the non-contact, in-situ measurement of the temperature of a diamond film, or other film material, during its chemical vapor deposition on an underlying substrate.

2. Description of the Related Art

It has long been known that diamond can be used in many diverse applications. In particular, diamond is finding increased use in the electronics industry.

Given the relative scarcity of natural diamond, there has been for some time a concerted effort to synthesize diamond in the laboratory. More recently, it has been found that it is possible to commercially produce polycrystalline diamond film using chemical vapor deposition (CVD) techniques.

Chemical vapor deposition, as its name implies, involves a gas-phase chemical reaction occurring above the surface of a solid substrate, which caused deposition of a CVD material film onto the substrate surface.

All CVD techniques for producing diamond films require some means of activating gas-phase carbon-containing precursor molecules. This generally involves thermal or plasma activation, or the use of a combustion flame. While each technique may differ in its details, they all share common features. For example, CVD growth of diamond normally requires that the substrate on which the diamond film is grown be maintained at a predefined temperature during the CVD process.

One of the problems associated with manufacture of CVD diamond is that the higher growth rates required for commercial feasibility are achieved only with a corresponding decrease in diamond film quality. To a great extent, this loss of quality results from a lack of precise temperature control of the deposited material during the CVD process.

Therefore, it would be highly desirable to have available a technique for measuring and, thus, for controlling the temperature of deposited diamond film during the CVD process.

SUMMARY OF THE INVENTION

The present invention provides a method and apparatus for the non-contact, in-situ temperature measurement of a layer of material during chemical vapor deposition (CVD) of the layer of material. In accordance with the invention, magnitude modulated ultraviolet (UV) light having a plurality of separated spectral components is directed at the deposited material. The modulated UV light has a plurality of wavelengths corresponding to different temperature dependencies of absorptance in the deposited material. The separated spectral components are within transparency spectral windows of a plasma media contained in the CVD reactor. A portion of the magnitude modulated UV light is directed as a reference into a comparison device, such as a spectrophotometer. The light reflected by the deposited material is also directed from the CVD reactor into the comparison device. That is, the magnitudes of the magnitude modulated component of reflected light and the reference light are compared at more than one spectral component. From this comparison is derived the temperature of the deposited material. The results of the comparison are then utilized in a feedback loop to control the temperature of the deposited material, typically by controlling the temperature of the substrate on which the material is being deposited.

Those skilled in the art will appreciate that the techniques of the present invention can be used for materials other than diamond by adjusting the spectral windows of light in the algorithm for deriving the deposited film temperature based on results of the magnitude comparisons for that particular material and CVD conditions.

A better understanding of the features and advantages of the present invention will be obtained by reference to the following detailed description and accompanying drawings that set forth an illustrative embodiment in which the principles of the invention are utilized.

DETAILED DESCRIPTION

Figure 1:
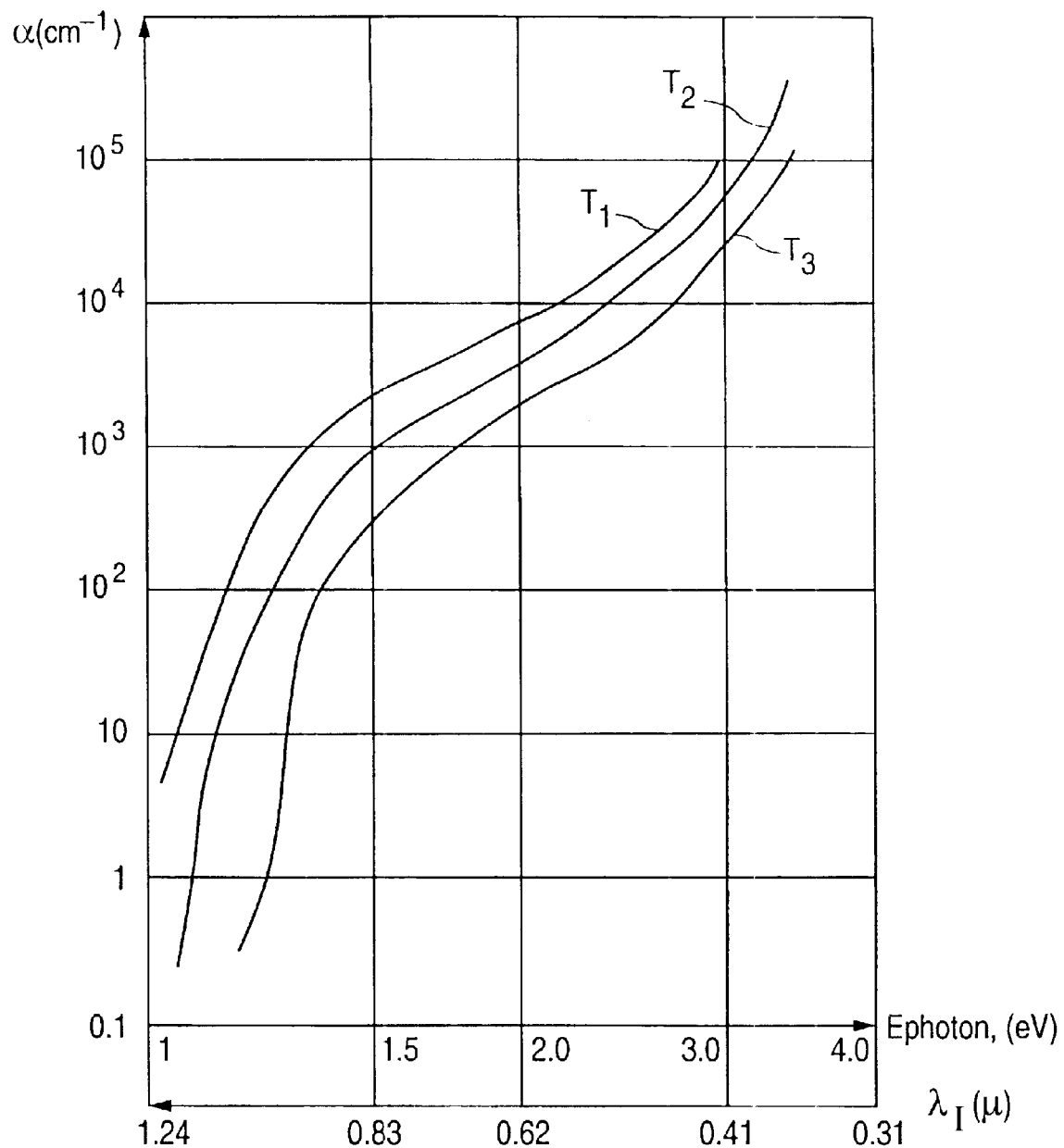
FIG. 1 is a graph illustrating absorptance of light of different wavelengths in a silicon substrate at three different silicon substrate temperatures.

FIG. 1 shows that the absorptance $\alpha$ of light of a given wavelength $\lambda$ in a silicon substrate will vary depending upon the temperature (T) of the silicon substrate. This fact is equally applicable to other materials, such as deposited diamond. Thus, a similar graph can be constructed for deposited diamond, and for a great many other materials typically formed by chemical vapor deposition (CVD). In accordance with the present invention, this fact is utilized to provide a method and apparatus for the non-contact, in-situ measurement of the temperature of a CVD diamond or other film.

From FIG. 1, it can be seen that absorptance $\alpha$ is a function of both wavelength $\lambda$ and temperature T. That is, for a given wavelength $\lambda_n$ $$\alpha(\lambda_n,T)=_\alpha\lambda_n(T)=\alpha_n(T)$$

Figure 2:
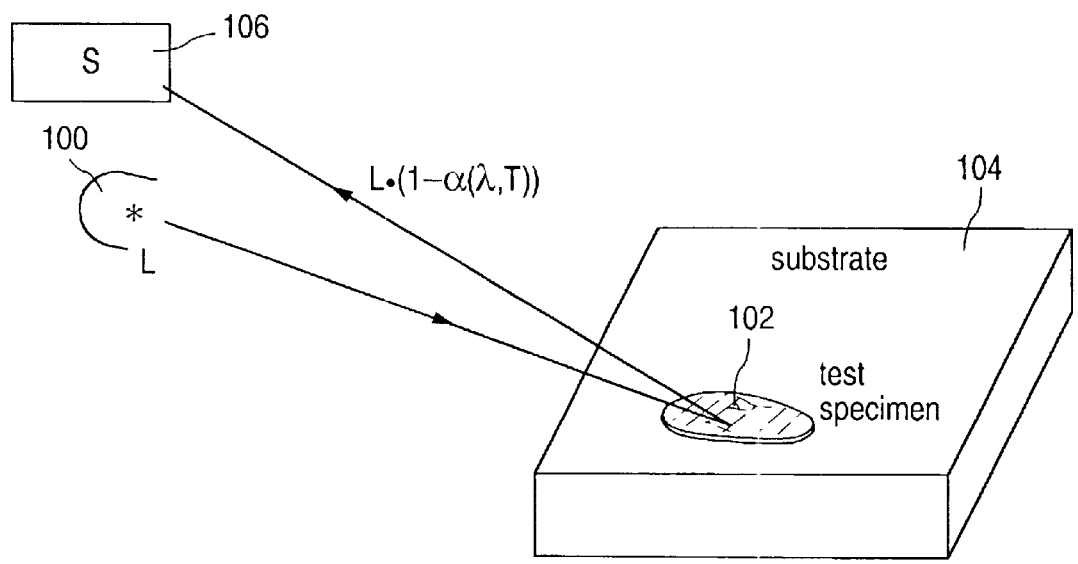
FIG. 2 is a pictoral illustration of a method for the non-contact measurement of temperature in a CVD diamond process in accordance with the concepts of the present invention.

FIG. 2 illustrates the general concepts of the present invention. As shown in FIG. 2, magnitude modulated UV light L from a light source 100 is directed at a CVD deposited material film 102 forming on an underlying substrate 104. The magnitude modulated UV light includes a plurality of separated spectral components with wavelengths corresponding to different temperature dependencies of absorptance of the deposited film 102. As discussed in greater detail below, the separated spectral components are selected to be within the transparency spectral windows of the plasma media contained in the CVD reactor in which the film 102 is being deposited.

Further in accordance with the present invention, but not shown in FIG. 2, a portion of the magnitude modulated UV light is directed to a comparison device 106, such as a spectrophotometer. Light reflected from the film 102 which is being deposited in the point of interest in the CVD reactor is also directed to the comparison device 106. The comparison device 106 compares the magnitude, i.e. $L \cdot (1-\alpha(\lambda,T))$, of the magnitude modulated component of the reflected light and the magnitude L of the reference light at more than one spectral component, as discussed above. Based on a comparison of the reflected light and the reference light, an algorithm is utilized to determine the temperature of the deposited film 102. The results of the comparison are, thus, utilized in a feedback mode to control the temperature of the deposited film 102, typically by controlling the temperature of the substrate 104 upon which the film 102 is being deposited.

Figure 3:
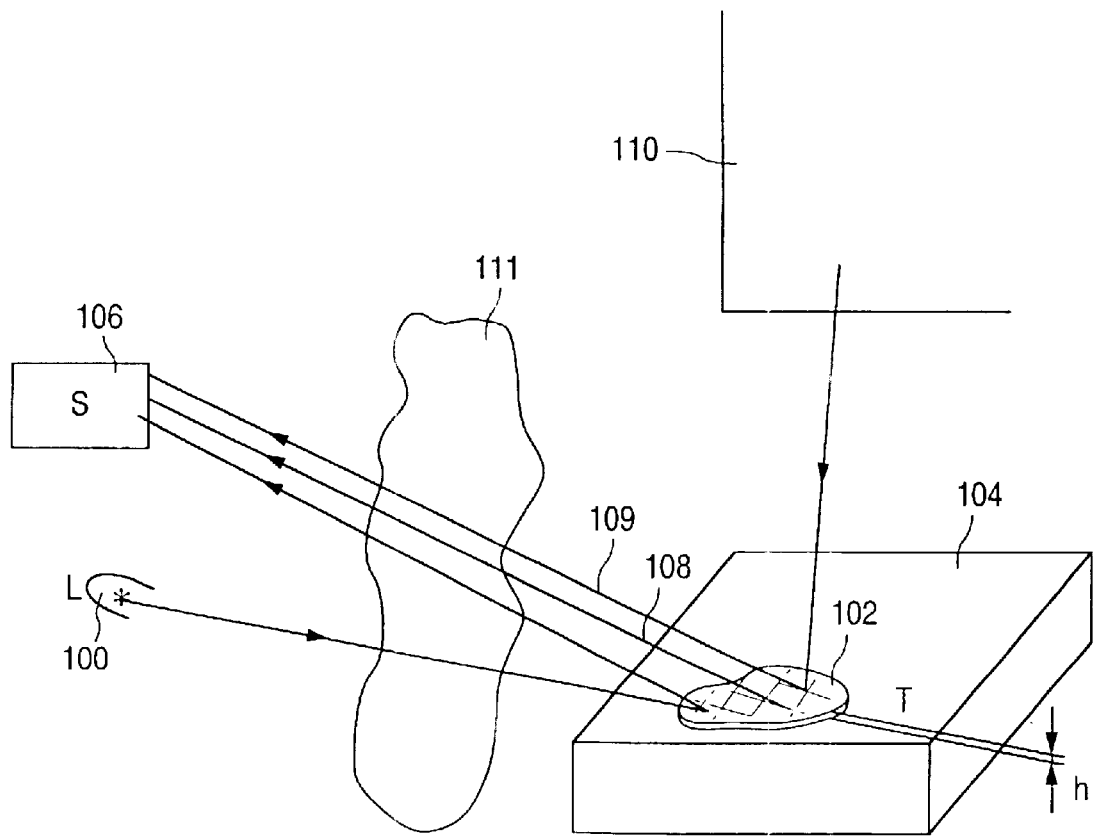
FIG. 3 is a pictoral illustration of error sources that can be introduced into the FIG. 2 method.

In accordance with the present invention, the algorithm utilized for determining the temperature of the deposited film 102 compensate for potential errors that can be introduced into the calculation of the film temperature. For example, as shown in FIG. 3, parameters that must be considered in determining the temperature of the film 102 include film thickness h, light 108 caused by the heat of radiation of the film 102, light 109 that comes to the film 102 from other sources 110 as reflected off the film 102 to the comparison device 106, and light absorptance in the media 111 contained in the CVD reactor. As stated above, these errors can be eliminated by choosing an appropriate source 100 of light L in appropriate operating wavelengths.

The last source of error, the fact that the temperature measured is the temperature of the deposited film 102, which is slightly higher than the Temperature T of the underlying substrate 102, can be avoided by appropriate calibration of the temperature control mechanism.

More specifically, with reference to FIG. 3, the total light incoming to the comparison device 106 will include the following components:

(1) light reflected from the film 102;

(2) dispersed light reflected from the film 102, which will depend on the film temperature $T_f$ and the film thickness h;

(3) light reflected by the substrate 104 on the boundary between the film 102 and the substrate 104 and dispersed by the film 102, which will depend on the substrate temperature $T_s$ and the thickness of the film h;

(4) light secondarily-reflected from the walls of the CVD reactor and then by the film 102 (the effect of this component may be small if, for example, the bright spot of incoming light is small and/or the geometry of the CVD reactor is right; this component may also be taken into account with a correction factor or calibration);

(5) light radiated by the hot environment (e.g., plasmatron's, arc, hot walls, etc.) and re-reflected by the film 102; and (6) light that is partially lost in the plasma that fills the CVD reactor chamber.

Considering these components, light of a given wavelength $\lambda$ incoming to the comparison device 106 can be described as:

$$L_\lambda^{in} = KL_\lambda^{out}[1-\alpha_\lambda(T_f)-\beta_\lambda(T_S)\alpha_\lambda(T_f)]\gamma_\lambda + W_\lambda$$

where:

K=geometry factor of reactor $T_f$=film temperature $T_S$=film/substrate boundary temperature $(1-\gamma_\lambda)$=absorptance in CVD plasma $W_\lambda$=radiation from hot environment re-reflected by film 102.

To exclude $W_\lambda$ from $L_\lambda^{in}$, a magnitude modulated light source (periodic, with frequency Ω) is used. By using for the analysis only light modulated on the same frequency part of the output of the comparison device 106, the radiation of the hot environment having no periodic component of the same frequency Ω, $W_\lambda$ is completely removed from the data analysis.

In other words, the first Fourier component of the output of the comparison device 106 is utilized (or, simply, a high-pass filter is used to reject the DC component of the output). In this way, for the Fourier component of the modulated light (or, the AC part of the output of the linear comparison device 106):

$$L_{in\atop\lambda} = KL_{out\atop\lambda}[1-\alpha_\lambda(T_f)-\beta_\lambda(T_s)\alpha_\lambda(T_f)]\gamma_\lambda$$

or $$L_{in\atop\lambda} \div L_{out\atop\lambda} = K[1-\alpha_\lambda(T_f)-\beta_\lambda(T_s)\alpha_\lambda(T_f)]\gamma_\lambda$$

The ratio $$R_\lambda = L_{in\atop\lambda} \div L_{out\atop\lambda}$$

is the result measured by comparison device 106.

As stated above, the plasma absorptance $(1-\gamma_\lambda)$ introduces additional uncertainty into the results of the analysis. Plasma absorptance $\gamma_\lambda$ depends on light wavelength $\lambda$. Since the plasma typically has transparency windows in the visual as well as the UV spectral areas, where $\gamma_\lambda=1$. Thus, choosing the wavelength $\lambda$ of the incoming light to be within transparency windows eliminates this error component; thus $$R\lambda = K[1-\alpha_\lambda(T_f)-\beta_\lambda(T_S)\alpha_\lambda(T_f)]$$

Figure 4:
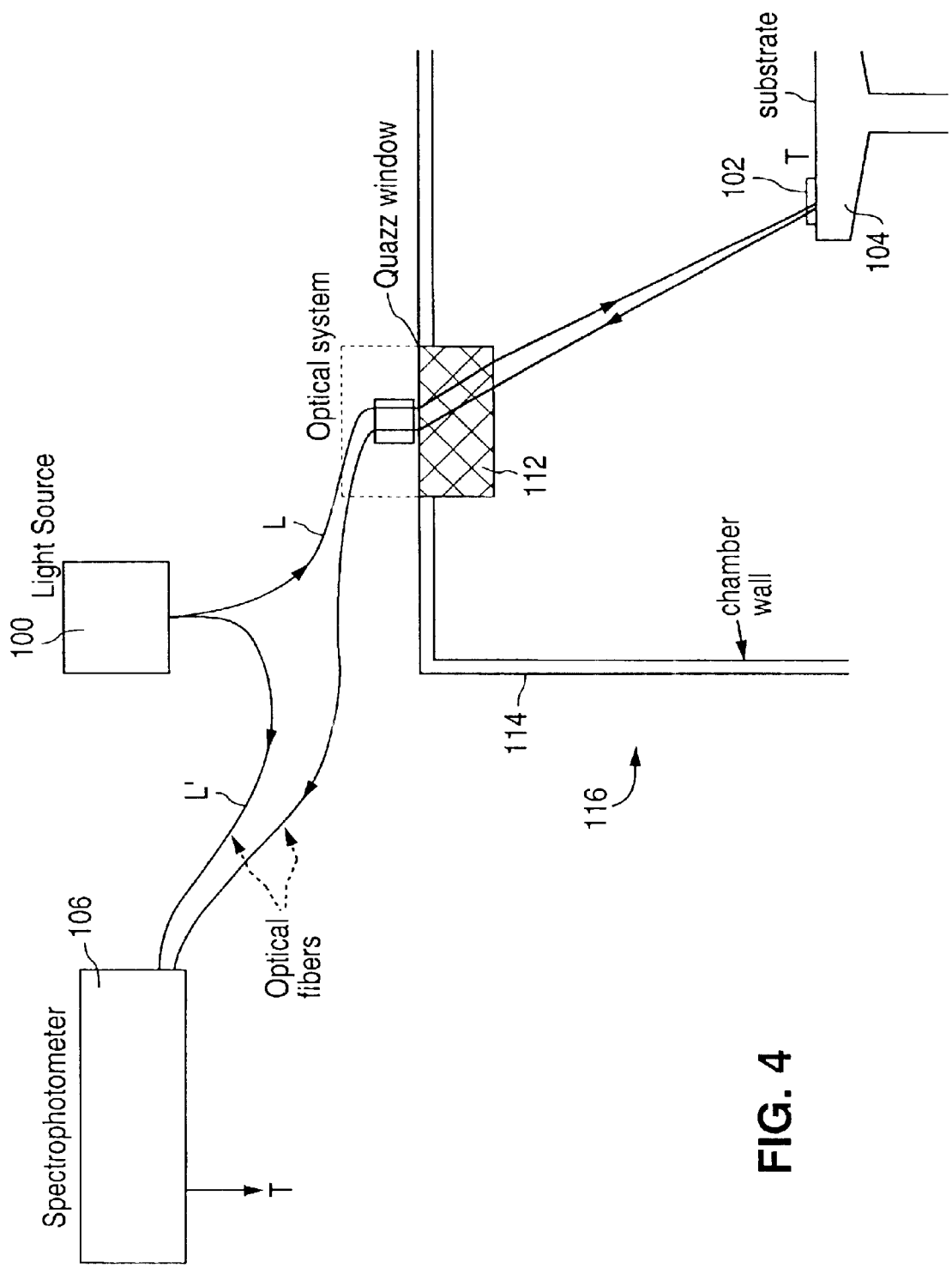
FIG. 4 is a block diagram illustrating a system for the non-contact measurement of temperature in a CVD diamond process in accordance with the concepts of the present invention.

FIG. 4 shows a system for measurement of the substrate temperature. As shown in FIG. 4, light L from a light source 100 can be directed to the deposited film 102 via an optical system that includes a quartz window 112 in the chamber wall 114 of the CVD reactor 116. FIG. 4 also shows a portion of the light L from the light source 100 being directed to the spectrophotometer 106. The light reflected from the deposited film 102 is directed back through the quartz window 112 and the optical system and to the spectrophotometer 106 for comparison with the reference light L. The temperature determined by the spectrophotometer system 106 is then utilized to control the temperature of the substrate 104 on which the film 102 is deposited, thereby controlling the temperature of the deposited film 102. Those skilled in the art will appreciate that the temperature control mechanism can be any well-known and conventional system suitable for this purpose and connected between the spectrophotometer 106 and the substrate 104.

With respect to the algorithm utilized by the spectrophotometer system 106 to determine film temperature, reference is make to the equations provided above. The term $R_\lambda$ is a measured value; the unknowns are K, $\alpha$ ($T_f$), $\beta_\lambda(T_S)$. Actually, in a linear approximation $$R\lambda = K[1-\alpha^o_\lambda(T_f)-h\alpha_\lambda(T_f)-h\beta(T_S)\alpha_\lambda(T_f)]$$

where:

K=geometrical factor
h=film thickness
$\alpha_\lambda(T)$=film absorptance
$\beta(T)$=film/substrate boundary reflectance
and $\alpha^o_\lambda(T)$, $\alpha_\lambda(T)$, $\beta(T)$ are known calibrated functions of T.

Given that $\alpha^o_\lambda(T)$, $\alpha_\lambda(T)$ and $\beta(T)$ are known calibrated functions of T, we have the following four unknown variables in the equilibrium for $R_\lambda K$, h, $T_S$ and T. Therefore, four equilibria are needed to solve for these four unknowns. Thus, for measurements $R_{\lambda 1}$, $R_{\lambda 2}$, $R_{\lambda 3}$ and $R_{\lambda 4}$ 2t four different wavelengths are needed.

In some instances, the geometric factor K may be pre-calibrated for a particular CVD reaction after installation of the temperature control system. If K is know, then only three variables need be defined, requiring only three measurements at three different wavelengths.

To solve the system at equilibria, one can use, for example, computer or look-up tables.

As indicated in FIG. 4, all light transmissions can be carried by optical fibers, i.e. between the light source and the CVD reactor, reference light between the light source and the spectrophotometer and, in the case of the reflected light, from the CVD reactor to the spectrophotometer.

It should be understood that various alternatives to the embodiment of the invention described herein may be employed in practicing the invention. Thus, it is intended that the following claims define the scope of the invention and that methods and apparatus within the scope of these claims and their equivalents be covered thereby.

What is claimed is:

1. An apparatus for the non-contact, in-situ temperature measurement of a substrate during chemical vapor deposition (CVD) of a material film on the substrate in a CVD reactor vessel that contains a plasma media, the apparatus comprising:

a light comparison device;

a light source that provides magnitude modulated UV light having a plurality of separated spectral components with wavelengths corresponding to different temperature dependencies of absorptance in the material film, the separated spectral components being within transparency spectral windows off the plasma media contained in the reactor vessel;

an optical system that directs a first portion of the magnitude modulated light at the material film, directs a second portion of the magnitude modulated light at the light comparison device, and directs light reflected from the material film at the light comparison device, and wherein the light comparison device compares the second portion of the magnitude modulated light and the light reflected from the material film to determine a temperature at the material film; and a temperature control system that utilizes the determined temperature to control the temperature of the substrate.

* * * * *